(12) United States Patent  (10) Patent No.: US 8,576,640 B2
Song  (45) Date of Patent: Nov. 5, 2013

(54) DATA OUTPUT APPARATUS AND METHOD FOR OUTPUTTING DATA THEREOF

(71) Applicant: SK Hynix Inc., Ichon (KR)

(72) Inventor: Ho-Uk Song, Ichon (KR)

(73) Assignee: SK hynix Inc. (KR)

( * ) Notice: Subject to any disclaimer, the term of this patent is extended or adjusted under 35 U.S.C. 154(b) by 0 days.

(21) Appl. No.: 13/692,685

(22) Filed: Dec. 3, 2012

(65) Prior Publication Data

US 2013/0093473 A1   Apr. 18, 2013

Related U.S. Application Data

(62) Division of application No. 12/347,287, filed on Dec. 31, 2008, now Pat. No. 8,331,167.

(30) Foreign Application Priority Data

May 8, 2008   (KR) ......................... 10-2008-0043025

(51) Int. Cl.
  *G11C 7/00*   (2006.01)
(52) U.S. Cl.
  USPC .......... 365/189.14; 365/226; 326/27; 326/30; 326/62

(58) Field of Classification Search
  USPC .................... 365/189.14, 226; 326/27, 30, 62
  See application file for complete search history.

(56) References Cited

U.S. PATENT DOCUMENTS

| 5,488,326 A | 1/1996 | Shiraishi et al. |
| 6,255,850 B1 | 7/2001 | Turner |
| 2003/0197525 A1* | 10/2003 | Song et al. ...................... 326/30 |
| 2006/0221717 A1 | 10/2006 | Lee |
| 2009/0279369 A1 | 11/2009 | Song |

FOREIGN PATENT DOCUMENTS

KR   1020000041373   7/2000

* cited by examiner

*Primary Examiner* — Vu Le
*Assistant Examiner* — Han Yang
(74) *Attorney, Agent, or Firm* — Baker & McKenzie LLP

(57) ABSTRACT

A data output apparatus includes a driver driving unit configured to generate driving signals by using input data when a data output enable signal is enabled, a data driver unit configured to drive an output terminal to a level corresponding to the input data in response to the driving signals to generate output data, and an output data level control unit configured to open a current path to control a level of the output data, wherein the current path is different from a current path for driving the output terminal to a level corresponding to the input data.

6 Claims, 3 Drawing Sheets

DATA OUTPUT APPARATUS AND METHOD FOR OUTPUTTING DATA THEREOF

CROSS-REFERENCES TO RELATED APPLICATION

The present application claims priority to and is a divisional application of U.S. patent application Ser. No. 12/347,287 entitled "Data Output Apparatus and Method for Outputting Data Thereof" filed Dec. 31, 2008 which claims priority under 35 U.S.C. §119(a) to Korean application number 10-2008-0043025, filed on May 8, 2008 in the Korean Intellectual Property Office, both of which are incorporated by reference in their entirety as if set forth in full.

BACKGROUND

1. Technical Field

The embodiments described herein relate to a semiconductor integrated circuit, and more particularly, to a data output apparatus.

2. Related Art

In mobile semiconductor memory devices, the need for low power consumption and high speed operation has increased. Accordingly, it is necessary to design a semiconductor integrated circuit that satisfies low power consumption and high speed operation characteristics. Among apparatuses composing a semiconductor integrated circuit, a data output apparatus is a device that has significant influences on power consumption and operation speed.

FIG. 1 is a schematic circuit diagram of a conventional data output apparatus. In FIG. 1, a data output apparatus 1 includes an inverter IV1, a NAND gate ND1, a NOR gate NR1, a first transistor M1, and a second transistor M2. In addition, a semiconductor integrated circuit includes a plurality of data input/output pads DQ functioning as output terminals to output data. Accordingly, when a data output enable signal 'DOUT_EN' is enabled to a logical high level, the NAND gate ND1 and the NOR gate NR1 operate as an inverter, respectively. Here, the data output enable signal 'DOUT_EN' is a signal that is enabled to a logical high level according to a read operation.

A pull-up driver, i.e., the first transistor M1 drives the pad DQ to a level of power supply voltage source VDDQ when an input data signal 'DATA' is at a logical high level. On the contrary, a pull-down driver, i.e., the second transistor M2, drives the pad DQ to a level of ground voltage source VSSQ when the input data signal 'DATA' is at a logical low level.

As shown in FIG. 1, the data output apparatus 1 is designed such that output data swings between a level of power supply voltage VDDQ and a level of ground voltage VSSQ, and it has no additional circuit for termination function. Here, the termination function has an effect to improve data transmission speed to restrict a swing range of data in order to improve data transmission speed. However, the termination function increases power consumption. Thus, a data output apparatus has no additional circuit construction for termination function.

FIG. 2 is a waveform demonstrating output data of the apparatus of FIG. 1. In FIG. 2, it may happen that a level of power supply voltage source VDDQ deviates from a predetermined level due to noise. In this case, data output from a data output apparatus may also include a noise component, such as region A of FIG. 2. As a result, the data output apparatus 1 (in FIG. 1) is problematic.

First, since the data output apparatus 1 has no termination function, there is a problem that data transmission speed is degraded. When a circuit construction for termination function is added, data transmission speed may be improved, but power consumption increases. Accordingly, the data output apparatus 1 has a difficulty in simultaneously satisfying low power consumption and high speed operation requirements.

Second, when a power supply voltage source VDDQ abnormally varies, a level of data output from the data output apparatus 1 (in FIG. 1) becomes unstable. Accordingly, an operation error may be caused in a system that receives the data output from the data output apparatus 1.

SUMMARY

A data output apparatus capable of satisfying low power consumption and high speed operation characteristics and capable of producing reliable data irrespective of variations of power supply voltage source are described herein.

In one aspect, a data output apparatus includes a driver driving unit configured to generate driving signals by using input data when a data output enable signal is enabled, a data driver unit configured to drive an output terminal to a level corresponding to the input data in response to the driving signals to generate output data, and an output data level control unit configured to open a current path to control a level of the output data, wherein the current path is different from a current path for driving the output terminal to a level corresponding to the input data.

In another aspect, a data output apparatus includes a first driver configured to drive output data to a first level, a second driver configured to drive the output data to a second level, and an output data level control unit configured to lower a level of the output data by a predetermined level when the first driver operates, and raise the level of the output data by a predetermined level when the second driver operates.

In another aspect, a data output apparatus includes a driver driving unit configured to generate driving signals by using input data, a data driver unit configured to drive an output terminal to a level corresponding to the input data in response to the enabled driving signals to generate output data, and a data output terminal termination unit configured to restrict a variation width of voltage level of the output data by forming a current path, wherein the current path is different from a current path for driving the output terminal to a level corresponding to the input data, in response to the enabled driving signals.

In another aspect, a method for outputting data in a data output apparatus comprises generating driving signals from input data, driving an output terminal to a level corresponding to the input data in response to the enabled driving signals to generate output data, and restricting a variation width of voltage level of the output data by forming a current path.

These and other features, aspects, and embodiments are described below in the section "Detailed Description."

BRIEF DESCRIPTION OF THE DRAWINGS

Features, aspects, and embodiments are described in conjunction with the accompanying drawings, in which.

DETAILED DESCRIPTION

Figure 1:
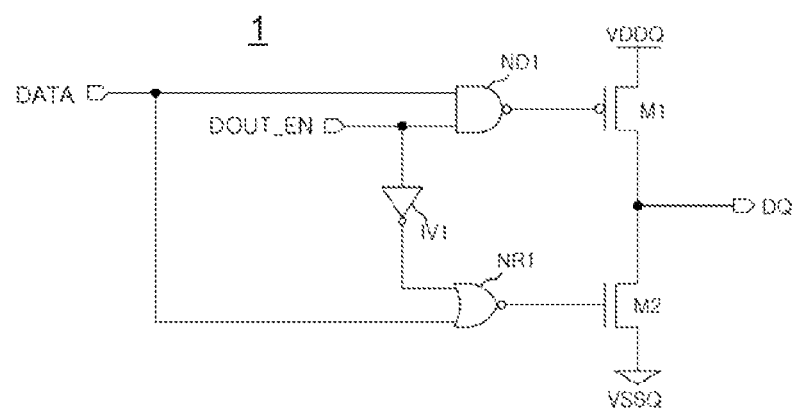
FIG. 1 is a schematic circuit diagram of a conventional data output apparatus.
Figure 2:
FIG. 2 is a waveform demonstrating output data of the apparatus of FIG. 1.
Figure 3:
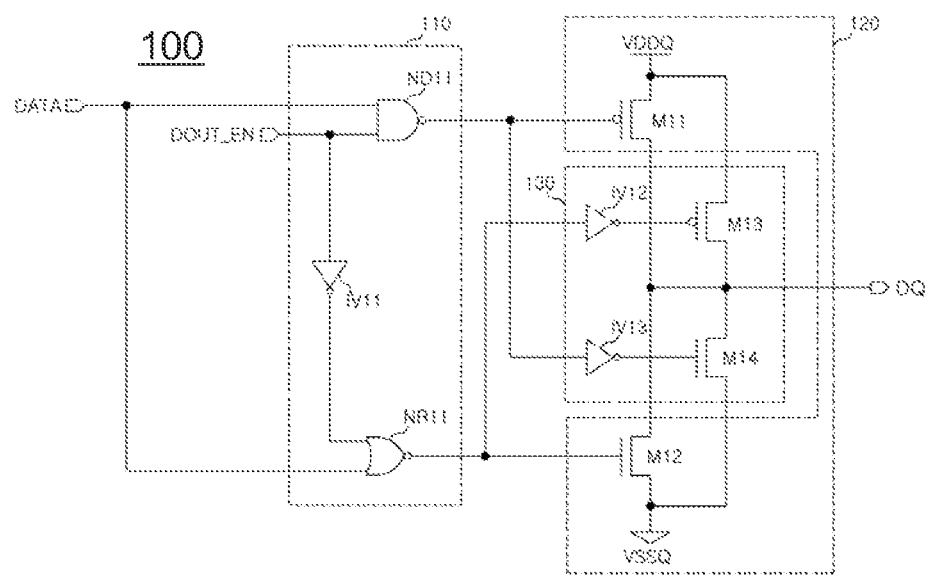
FIG. 3 is a schematic circuit diagram of an exemplary data output apparatus according to one embodiment.

FIG. 3 is a schematic circuit diagram of an exemplary data output apparatus according to one embodiment. In FIG. 3, a data output apparatus 100 can be configured to include a driver driving unit 110, a data driver unit 120, and an output data level control unit 130.

The driver driving unit 110 can receive input data signals 'DATA' to output driving signals when a data output enable signal 'DOUT_EN' is enabled. For example, the data output enable signal 'DOUT_EN' can be a signal that can be enabled to a logical high level according to a read operation of a semiconductor memory device.

The driver driving unit 110 can include a first inverter IV11, a NAND gate ND11, and a NOR gate NR11. The first inverter IV11 can receive the data output enable signal 'DOUT_EN' as input. The NAND gate ND11 can receive the input data signal 'DATA' and the data output enable signal 'DOUT_EN'. The NOR gate NR11 can be configured to receive the input data signal 'DATA' and an output signal of the first inverter IV11.

The data driver unit 120 can drive an output terminal, i.e., a pad DQ, to a level of power supply voltage source VDDQ or ground voltage source VSSQ, which can correspond to the input data signal 'DATA', in response to the driving signals to generate output data. For example, the data driver unit 120 can include a first driver and a second driver, i.e., a first transistor M11 and a second transistor M12, respectively. The first transistor M11 can be structured to operate as a pull-up driver and the second transistor M12 can be structured to operate as a pull-down driver.

In FIG. 3, the first transistor M11 can have a gate terminal receiving an output signal of the NAND gate ND11, a source terminal connected to a power supply voltage source VDDQ terminal, and a drain terminal connected to the pad DQ. The second transistor M12 can have a gate terminal receiving an output signal of the NOR gate NR11, a source terminal connected to a ground voltage source VSSQ terminal, and a drain terminal connected to the pad DQ.

The output data level control unit 130 can be configured to open a current path, which is opposite to (different from) a current path for driving a logical level of the input data signal 'DATA', to control a level of an output signal of the data driver unit 120, i.e., a level of output data. Accordingly, by controlling the level of the output data, a swing width of the output data can be adjusted and noise can be removed. For example, since the output data level control unit 130 can perform a termination function, which can restrict a swing width of the output data to a width narrower than a width between a level of the power supply voltage source VDDQ and a level of the ground voltage source VSSQ, the output data level control unit 130 can function as a data output terminal termination unit.

The output data level control unit 130 can be configured to include a second inverter IV12, a third inverter IV13, and third and fourth drivers, i.e., a third transistor M13 and a fourth transistor M14, respectively. The second inverter IV12 can receive an output signal of the NOR gate NR11. The third transistor M13 can have gate terminal receiving an output signal of the second inverter IV12, a source terminal connected to the power supply voltage source VDDQ terminal, and a drain terminal connected to the pad DQ. The third inverter IV13 can receive an output signal of the NAND gate ND11. The fourth transistor M14 can have gate terminal receiving an output signal of the third inverter IV13, a source terminal connected to the ground voltage source VSSQ terminal, and a drain terminal connected to the pad DQ.

The third transistor M13 and the fourth transistor M14 included in the output data level control unit 130 can function to have relatively weaker current driving capabilities than the first transistor M11 and the second transistor M12 in the data driver unit 120. For example, the third transistor M13 and the fourth transistor M14 can have relatively smaller sizes than the first transistor M11 and the second transistor M12.

Figure 4:
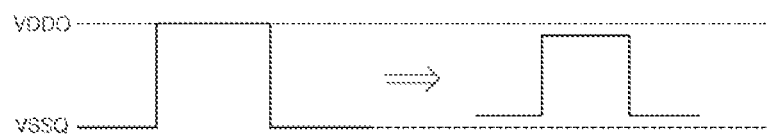
FIGS. 4 and 5 are waveforms demonstrating exemplary output data of the apparatus of FIG. 3 according to one embodiment.
Figure 5:
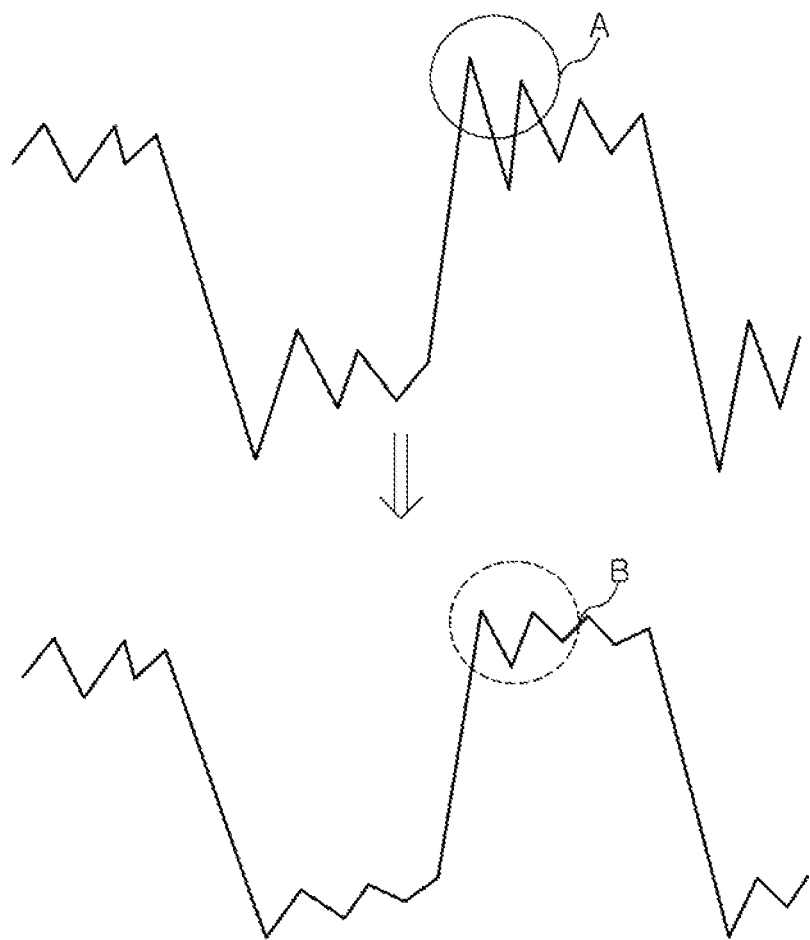

An exemplary operation of a data output apparatus will now be described with reference to FIGS. 3-5. FIGS. 4 and 5 are waveforms demonstrating exemplary output data of the apparatus of FIG. 3 according to one embodiment. Here, FIG. 4 shows waveforms of ideal data and FIG. 5 shows waveforms of realistic data.

In FIGS. 3-5, when in a read operation of a semiconductor integrated circuit, the data output enable signal 'DOUT_EN' can be enabled to a logical high level. When input data signal 'DATA' is at a logical high level, since the data output enable signal 'DOUT_EN' is at a logical high level, a NAND gate ND11 of a driver driving unit 110 can output a logical low level signal and a NOR gate NR11 thereof can output a logical low level signal. For example, since the NAND gate ND11 can output a logical low level signal and the NOR gate NR11 can output a logical low level signal, a first transistor M11 of a data driver unit 120 can be turned ON and a second transistor M12 thereof can be turned OFF, and a fourth transistor M14 of an output data level control unit 130 can be turned ON and a third transistor M13 thereof can be turned OFF. Thus, the first transistor M11 can drive a pad DQ to a level of power supply voltage source VDDQ.

Since the turned-ON fourth transistor M14 can form a current path from the pad DQ to a ground voltage source VSSQ terminal, the fourth transistor M14 can lower a voltage level of the pad DQ, i.e., a level of output data. Here, the fourth transistor M14 is exemplified having a weaker current driving capability than the first transistor M11 has. Thus, as shown in FIG. 4, the fourth transistor M14 can perform a termination function for reducing a swing width by not changing a logical level itself of output data but lowering the level of output data by a predetermined level. For example, when a voltage level of output data at a logical high level is about 1.8V, it is possible to make the voltage level of output data at a logical high level about 1.7V, as the fourth transistor M14 functions.

In addition, the fourth transistor M14 can perform a clamping function to prevent the level of output data from rising over a predetermined level due to noise components included in the power supply voltage source VDDQ. For example, as shown in FIG. 5, a noise component A can be removed by a clamping function of the fourth transistor M14, as shown in output data B.

An exemplary operation when the input data signal 'DATA' is at a logical low level in the read operation will now be described. As shown in FIG. 3, since the data output enable signal 'DOUT_EN' is at a logical high level, the NAND gate ND11 in the driver driving unit 110 can output a logical high level signal and the NOR gate NR11 thereof can output a logical high level signal. Accordingly, the first transistor M11 of the data driver unit 120 can be turned OFF and the second transistor M12 thereof can be turned ON. Thus, the second transistor M12 can drive the pad DQ to a level of ground voltage source VSSQ.

In addition, since the NAND gate ND11 can output a logical high level signal and the NOR gate NR11 can output a logical high level signal, the fourth transistor M14 of the output data level control unit 130 can be turned OFF and the third transistor M13 thereof can be turned ON. Since the third transistor M13 can form a current path from the power supply voltage source VDDQ terminal to the pad DQ, the third transistor M13 can raise a voltage level of the pad DQ, i.e., a level of output data. Here, the third transistor M13 is exemplified having a weaker current driving capability than the second transistor M12. Accordingly, as shown in FIG. 4, the third transistor M13 can perform a termination function for reducing a swing width by not changing a logical level itself of output data but raising the level of output data by a predetermined level. For example, when a voltage level of output data at a logical low level is about 0V, it is possible to make the voltage level of output data at a logical low level about 0.1V, as the third transistor M13 functions.

Moreover, the third transistor M13 can perform a clamping function to prevent the level of output data from being lowered to a level lower than a predetermined level due to noise components included in the ground voltage source VSSQ.

When in a write operation of a semiconductor integrated circuit, the data output enable signal 'DOUT_EN' can be disabled to a logical low level. Since, the data output enable signal 'DOUT_EN' is at a logical low level, the NAND gate ND11 of the driver driving unit 110 can output a logical high level signal and the NOR gate NR11 can output a logical low level signal. Accordingly, both the first transistor M11 and the second transistor M12 of the data driver unit 120 can be turned OFF. In addition, both the third transistor M13 and the fourth transistor M14 of the output data level control unit 130 can be turned OFF. Thus, when in a write operation of a semiconductor integrated circuit, the third and fourth transistors M13 and M14 of the output data level control unit 130 do not perform termination functions and clamping functions, thereby consuming a minimal amount of current.

Accordingly, the data output apparatus improves transition speed of output data by means of termination function for adjusting a swing width of data, thereby improving data transmission speed and effectively removes noise included in output data by means of clamping function. For example, the data output apparatus has the following effects. First, since termination functions can be performed only when in a read operation, the data output apparatus is capable of simultaneously satisfying low power consumption and high speed operation requirements. Second, since noise components included in data can be removed by means of clamping function, reliability of transmitted data can be improved by the data output apparatus.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A method for outputting data in a data output apparatus, comprising:
   generating driving signals from input data;
   driving an output terminal to a level corresponding to the input data in response to the enabled driving signals to generate output data; and
   restricting a variation width of voltage level of the output data by forming a current path.

2. The method of claim 1, further comprising disabling the driving signals while a data output operation is not performed.

3. The method of claim 1, further comprising opening a current path from the output terminal to a ground voltage source terminal to lower a level of the output data by a predetermined level when the input data is at a logical high level.

4. The method of claim 3, further comprising opening a current path from the output terminal to a power supply voltage source terminal to raise the level of the output data by a predetermined level when the input data is at a logical low level.

5. The method of claim 1, further comprising cutting-off the current path while a data output operation is not performed.

6. The method of claim 1, further comprising:
   driving the output terminal to a level of a power supply voltage source according to the input data; and
   driving the output terminal to a level of a ground voltage source according to the input data.

* * * * *